(12) United States Patent
Sokolov

(10) Patent No.: US 6,384,691 B1
(45) Date of Patent: May 7, 2002

(54) MILLIMETER WAVE LOW PHASE NOISE SIGNAL SOURCE MODULE

(75) Inventor: Vladimir Sokolov, Shakopee, MN (US)

(73) Assignee: TLC Precision Wafer Technology, Inc., Minneapolis, MN (US)

( * ) Notice: Subject to any disclaimer, the term of this patent is extended or adjusted under 35 U.S.C. 154(b) by 0 days.

(21) Appl. No.: 09/526,229

(22) Filed: Mar. 15, 2000

(51) Int. Cl.[7] .................................................. H03B 5/18
(52) U.S. Cl. ..................... 331/76; 331/107 SL; 331/99; 331/96; 331/108 C; 333/218
(58) Field of Search .......................... 331/76, 107 SL, 331/99, 117 D, 108 C, 96; 333/218; 455/327

(56) References Cited

U.S. PATENT DOCUMENTS 4,518,931 A * 5/1985 Rauscher ..................... 331/76
4,789,840 A * 12/1988 Albin ..................... 333/218 X

OTHER PUBLICATIONS

A New Integrated Waveguide–Microstrip Transition, J.H.C. Van Heuven, IEEE Transactions on Microwave Theory and Techniques, Mar. 1976, pp. 144–147.

* cited by examiner

*Primary Examiner*—Arnold Kinkead
(74) *Attorney, Agent, or Firm*—Roger W. Jensen

(57) ABSTRACT

A high frequency signal source module includes a housing have a high-Q dielectric puck and a transition enclosure employing an antipodal finline transition. A circuit module connected to the high-Q puck includes an oscillator circuit that cooperates with the high-Q puck, and a frequency doubling circuit. In turn, the output of the frequency doubler is coupled to the antipodal finline transition, and thence to the output standard rectangular waveguide.

13 Claims, 2 Drawing Sheets

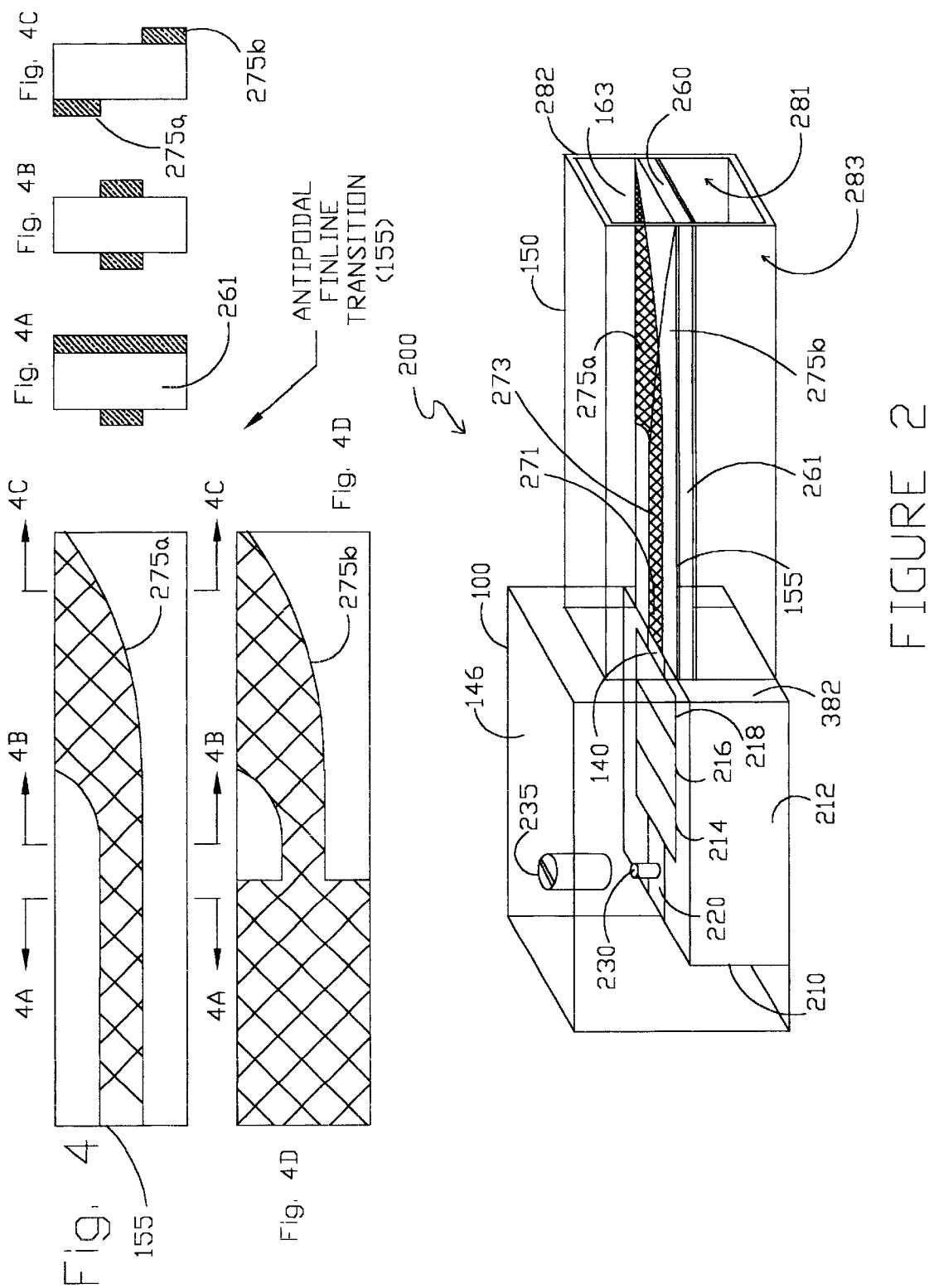

MILLIMETER WAVE LOW PHASE NOISE SIGNAL SOURCE MODULE

GOVERNMENT CONTRACT

This invention was made with Government support under Contract F30602-96-C-0147, awarded by the Air Force. The Government has certain rights in this invention.

FIELD OF THE INVENTION

The present invention relates generally to millimeter-wave components for communication applications, and more particularly to a millimeter-wave low phase noise signal source.

BACKGROUND OF THE INVENTION

The present invention generally relates to high-frequency circuit devices and modules, and more particularly to millimeter-wave and microwave devices and modules. State-of-the-art integrated circuit fabrication technology which permits low cost and low noise fabrication of such devices and modules is commonly referred to as MMIC technology, or simply MMIC integrated circuits, or MMIC multi-chip modules, and generally refers to both monolithic and hybrid manufacture processing techniques. Commonly such MMIC technology employs the use of GaAs or InP semiconductor fabrication techniques. Such MMIC circuits may also be fabricated by way of standard GaAs PHEMT-based MMIC processes commonly used for mm-wave MMICs, all of which are well known in the art.

MMIC high frequency devices useful in the telecommunication and radar arts include among others, basic oscillators, voltage-controlled oscillators, mixers and converters, as well as injection locked signal sources having power greater than the injected signal. Each of the aforementioned high frequency devices is well known in the art and are embodied in a wide array of circuit configurations employing a wide variety of circuit components including field effect transistors, varactors, diodes, and the like.

More specifically, a millimeter-wave signal source is commonly employed in a variety of signal applications such as vehicular radar, mm-wave terrestrial communications, and space communications including inter-satellite communication links. Many such applications generally require an ultra-stable mm-wave local oscillator signal source employed as a component of a transmitter and/or receiver circuit. Applications as these require a constant frequency signal source having very low phase noise at frequencies in the order of 110 GHz.

There is therefore a need for a high frequency ultra-stable frequency source that is low cost and simple to manufacture.

SUMMARY OF THE INVENTION

An object of the present invention is to provide a high frequency ultra-stable signal source that is low cost and simple to manufacture.

Another object of the present invention is to provide a high frequency signal source having low phase noise in a self-contained module.

In accordance with the present invention, a high frequency signal source employs a first signal source circuit means for providing a reference output signal at frequency $f_r$, a frequency doubling circuit means responsive to the reference output signal for providing a first output signal at frequency $f_2$, where $f_2$ is twice the value $f_r$. In turn, the output of the frequency doubling circuit is coupled to a high frequency waveguide employing an antipodal finline transmission line.

BRIEF DESCRIPTION OF THE DRAWINGS

FIG. 2 is a perspective view of a high frequency signal source module in accordance with the present invention.

FIG. 4 is a plan schematic view of transition 155.

FIGS. 4A, 4B and 4C are cross-sectional views of transition 155 as viewed, respectively, along section lines 4A—4A; 4B—4B; and 4C—4C.

FIG. 4D is a plan view of the opposite side of transition 155 illustrated in FIG. 4.

DETAILED DESCRIPTION OF THE INVENTION

Figure 1:
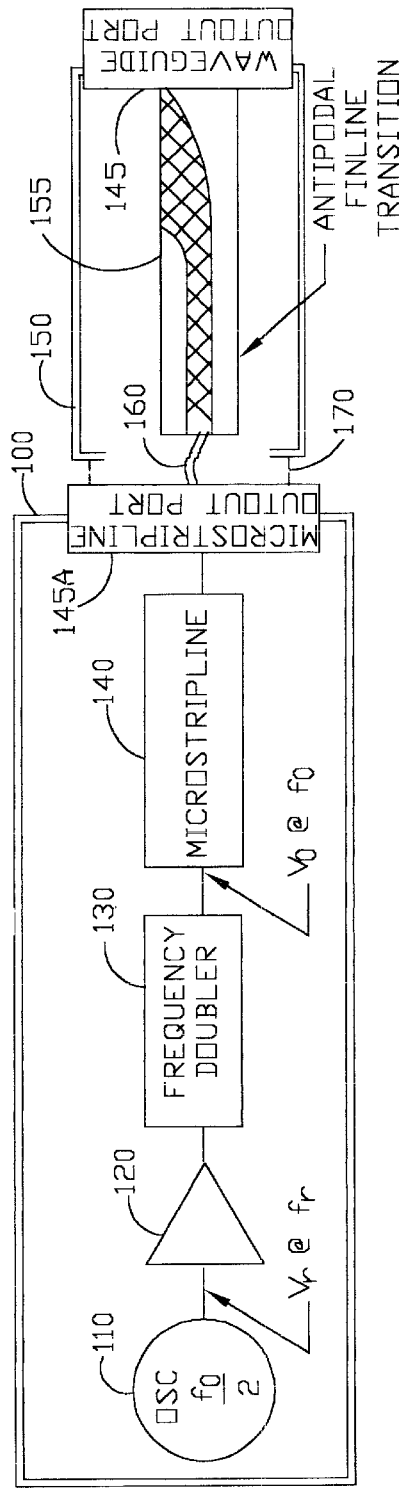
FIG. 1 is a schematic block diagram of present invention.

Illustrated in FIG. 1 is a schematic block diagram of a high frequency signal source in accordance with the present invention. There shown is a reference signal source depicted as an oscillator 110 having an output reference signal $V_r$ at frequency $f_r$. In turn, output reference signal $V_r$ is amplified by amplifier 120 and coupled to frequency doubler 130. Frequency doubler 130 provides an output signal $V_o$ at frequency $f_o$ where frequency $f_o$ is twice the value of the reference frequency $f_r$. The output microstrip line of the frequency doubler is coupled to a high frequency waveguide output port 145 by way of a microstripto-waveguide transition circuit employing an antipodal finline transition. These aforesaid functional circuit components are generally enclosed in a housing 100 as is common practice in high frequency devices, more specifically mm-wave and microwave circuit devices.

Microstrip line output port 145A is coupled to an output transition enclosure 150 including an antipodal finline transition line 155 by way of a high frequency signal coupling means 160. Dashed lines 170 generally indicates either a mechanical or integral coupling of housing 100 and transition enclosures 150 so as to achieve a low noise high frequency device assembly or physical module. In an exemplary embodiment of the invention, transition enclosure 150 is adapted at the right end thereof (as shown in FIG. 1) to have a standard waveguide opening, such as an opening of 0.100×0.05 inches (standard for a W-band waveguide).

Figure 3:
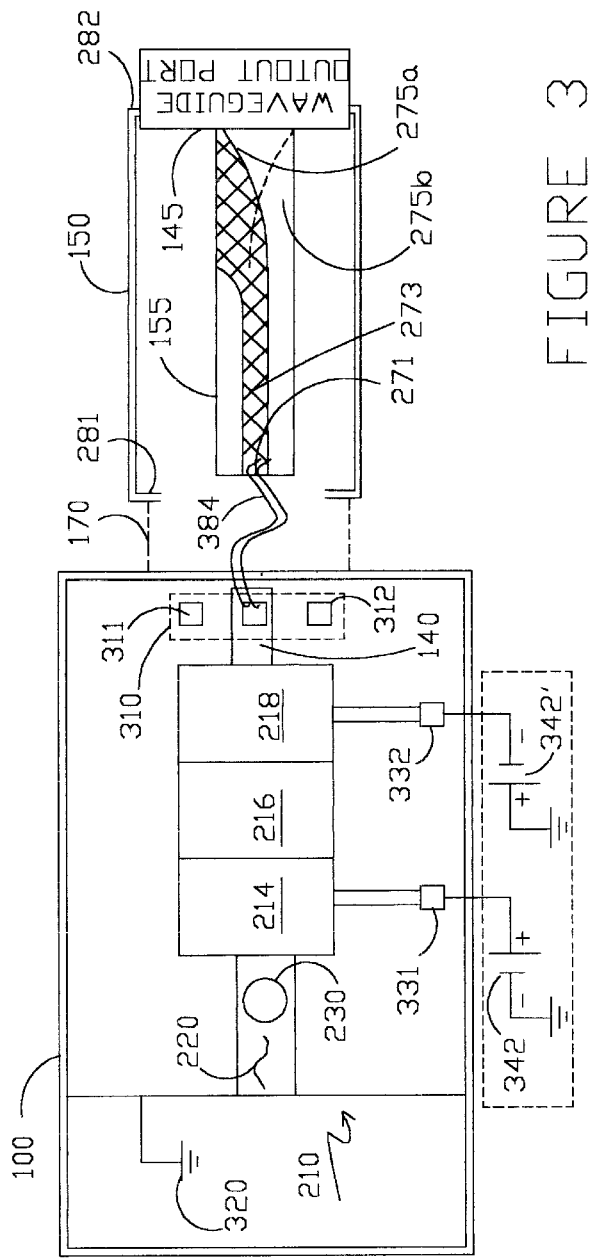
FIG. 3 is a partial plan view of the components illustrated in FIG. 2.

Illustrated in FIG. 2 is a perspective view of a high frequency signal source module 200 in accordance with the present invention. FIG. 3 is a partial plan view of the component layout as illustrated in FIG. 2. In FIGS. 2 & 3, like components as those illustrated in FIG. 1 have retained the same numeral designations in FIGS. 2 & 3.

As illustrated in FIGS. 2 & 3, there is provided an integrated circuit module 210 within housing 100. Integrated circuit module 210 is illustrated as including a metal plate or block 212, and monolithic integrated circuit chips 214, 216, and 218. For example, chips 214, 216, and 218 may provide the oscillator, 20 amplifier, and frequency doubler circuit functions, respectively, as previously described.

In one embodiment of the invention, metal plate 212 is a gold plated carrier block with high thermal conductivity for good heat sinking capability. The metal plate block may be fabricated, for example, by way of a metal block or metal matrix composite. Microstrip line substrates 220 and 140 are mounted on metal plate 212. Integrated circuit chips 214, 216, and 218 are mechanically mounted in cascade on the same surface of metal plate 212 as microstrip line substrates 220 and 140. Although not shown, coupling of microstrip 220 to an input terminating means of circuit chip 214, and coupling of microstrip 140 to an output terminating means of frequency doubler 218 may be accomplished by way of wire bonds, which is common practice in MMIC integrated circuit technology. Further, the integrated circuit chips are also electrically coupled in cascade and to the common ground plane provided by metal plate 212 by way of soldering or epoxying with conductive epoxy in accordance with common MMIC practice.

In an exemplary embodiment of the invention, integrated circuit chips 214, 216, and 218 may be fabricated in accordance with common MMIC integrated circuit fabrication techniques and processes, and may be constructed by way of GaAs or InP fabrication techniques. Alternatively, the circuit functions of integrated circuit chips 214, 216, and 218 may be replaced by a single integrated MMIC circuit chip having an input terminating means electrically coupled to microstrip line 220 and an output terminating means electrically coupled to microstrip line 140.

As is particularly illustrated in FIG. 3, integrated circuit module 210 includes a standard high frequency output port 310 having conductive pads 311 and 312 electrically connected to a module ground plane generally indicated by numeral 320. Further, conductive pads 331 and 332 are provided for receiving dual power supplies 342 and 342' for powering MMICs 214, 216, and 218.

Also illustrated in FIGS. 2 and 3 are a puck-shaped dielectric puck or block 230 coupled to microstrip line 220, and a mechanical frequency tuning means in the form of a screw type adjustment assembly generally indicated by numeral 235. Screw-type adjustment assembly 235 is intended to be held in position by way of being mounted to top member 146 of housing 100.

Dielectric block 230 is intended to provide a high-Q cavity to cooperate with oscillator circuit chip 214, and microstrip line 220 so as to form a dielectric resonator. Housing 100 is a generally enclosed structure providing a shielded environment to the dielectric resonator, and is constructed from a generally electrically conductive metallic material, for example, aluminum or brass. Alternatively, housing 100 may be constructed of plastic in which the inner members of housing 100 are coated with a contiguous coating of a generally electrically conductive material consistent with high frequency design criteria as is well understood in the art.

Coupled to housing 100 is a high frequency transition enclosure 150 including the antipodal finline microstrip-to-waveguide transition (after VanHeuven ≈ 1973), hereafter referred to as simply transition 155. Transition 155 may be constructed by way of a common double sided printed circuit board 260 having an electrically conductive material coating on both sides of a dielectric substrate 261.

Preferably, substrate 261 is 3–5 mils of Teflon material for high frequency applications, and the electrically conductive material is copper or Au-plated copper having a thickness of approximately 0.5 to 0.7 mils. The electrically conductive material on upper surface 163 of board 260 is etched or removed so as to create an electrically conductive transmission line having (i) at one end 271 a microstrip transmission line input means generally indicated by numeral 273, and (ii) at the opposite end of one of the fins of a pair of electrically conductive fins 275a and 275b on opposing sides of substrate 261. The opposite side (not shown) of board 260 contains the second fin which transitions to a contiguous coating of the electrically conductive material thereby forming a ground plane at end 271.

Transition enclosure 155 is shown in more detail in FIGS. 4, and FIGS. 4A–D, wherein the aforementioned conductive fins 275a and 275b, among other details, are shown.

The circuit board 260 constructed in accordance as just described, and illustrated particularly in FIGS. 2, 4, and 4A–4D, is centrally positioned within transition enclosure 150 and extends from broadwall 281 to broadwall 283 of transition enclosure 150.

Transition 155 is electrically connected to microstrip line 140 by way of wire or ribbon bonds as is generally indicated in FIG. 3 by numeral 384. Ribbon bond 384 is illustrated as electrically connecting microstrip line 140 to the microstrip-end 273 of transition 155. Transition enclosure 150 is illustrated as being electrically and mechanically connected to housing 100 and metal plate 212, forming a shielded enclosure for the entire assembly. In accordance with the present invention, the structure as just described, and more particularly the employment of transition 155, permits an in-line or co-linear transition between the output of the MMIC circuit or circuits, and more particularly to the output of the frequency doubler 120, namely chip 118, and the output of transition enclosure 150.

Housing 100 is either integral with transition enclosure 150 or is separately attached by screws and alignment pins at the interface plane 382, as shown in FIG. 2.

In accordance with the present invention, the combination of the housing 100, dielectric block 230, and oscillator 110 is constructed to form a high-Q dielectric resonator so as to provide a frequency source with low phase noise. Screw-type adjustment assembly 235 is intended to be metallic so as to cooperate with dielectric block 230 so as to be capable of affecting the resonant frequency of the resonator structure and thereby permit tuning of the reference frequency $f_r$ of oscillator 110. An exemplary frequency of oscillator 110 in accordance with the present invention is 38.5 GHz.

In accordance with the present invention, low phase noise at the waveguide output port is achieved by doubling a low phase noise oscillator operating at half of the intended output signal frequency. Since it is more practical to achieve a low phase noise signal source or oscillator at lower frequencies, an ultra-stable oscillator signal may be frequency doubled and still have the desired output signal that exhibits low phase noise characteristics. This is so even though frequency doubling theoretically worsens the phase noise by 6 dB for a given input frequency.

An exemplary embodiment of oscillator 110 has an output power of 10 to 40 milliwatts. Amplifier 120 is intended to be configured so as to have an output power in the range of 100 milliwatts. In turn, frequency doubler 130 may provide a signal having an output power of 1 to 10 milliwatts. The output signal from frequency doubler 130 is coupled to transition 155 and propagates from the left end 271 (as viewed in FIG. 2) of microstrip line 273 to end 282 of enclosure 150, and have an output power in the order of 1–10 milliwatts.

A typical size for integrated circuit chips 214, 216, and 218 by way of MMIC technology of is 2.2×1.3 mm². In contrast, a single integrated MMIC circuit chip embodying the circuit functions of chips 214, 216, and 218 may be in the order of 6×1.3 mm². The combination of the dielectric resonator structure of the present invention as illustrated in FIG. 2 is in the order of 5×2×2 cm³ and has an output signal of 77 GHz.

It should be recognized that the details of the high frequency signal source module depicted have been provided so as to offer a description of many variations of the module which may be achieved employing the novel signal source module of the present invention. These details may, of course, be altered, and such variations are intended to be within the true spirit and scope of the present invention.

The description of the present invention has set forth a novel high frequency signal source module which may be fabricated by low cost and reliable production techniques commonly referred to as Monolithic Microwave Integrated Circuit (MMIC) technology. Although particular integrated circuit chips performing particular circuit functions have been discussed above, other components may be added and similarly arranged, all of which are intended to be within the true spirit and scope of the present invention. More specifically, no details have been given as to the particular "circuit" configuration to achieve the well known mentioned circuit functions. This is so, since there is a wide array of circuit configurations that may be implemented to achieve the intended circuit function, all of which is within the knowledge of those skilled in the art.

Further, the invention has been described herein in considerable detail in order to comply with the Patent Statutes and to provide those skilled in the art with the information needed to apply the novel principles of the present invention, and to construct and use such exemplary and specialized components as are required However, it is to be understood that the invention may be carried out by specifically different equipment and devices, and that various modifications, both as to the equipment details and operating procedures, may be accomplished without departing from the true spirit and scope of the present invention.

More specifically, although the present invention has been illustrated by way of particular waveguide and housing designs, alternate designs and material selections are of course possible, and are also intended to be within the true spirit and scope of the present invention.

I claim:

1. A high frequency millimeter wave low phase noise signal source module comprising:
   an integrated circuit including circuit components therewith and arranged so as to provide:
      a first signal source means for providing a reference output signal at frequency $f_r$, and
      a frequency doubling circuit means responsive to said reference output signal for providing a first output signal at frequency $f_2$, where $f_2$ is twice the value $f_r$;
   a transition enclosure having an input port and an output port;
   an antipodal finline transition extending longitudinally between said input and output ports of said enclosure, said antipodal transmission line including a microstrip line end portion in proximity to said input port, and a split end portion in proximity to said output port; and
   means for coupling said first output signal to said microstrip line end portion of said antipodal transition.

2. A high frequency millimeter wave low phase noise signal source module comprising:
   a first signal source means for providing a reference output signal at frequency $f_r$;
   a frequency doubling circuit means responsive to said reference output signal for providing a first output signal at frequency $f_2$, where $f_2$ is twice the value $f_r$;
   a signal amplifier having an input means for receiving said reference output signal, and having an output means coupled to an input means of said frequency doubling circuit means;
   a transition enclosure having an input port and an output port;
   an antipodal finline transition extending longitudinally between said input and output ports of said enclosure, said antipodal transmission line including a microstrip line end portion in proximity to said input port, and a split end portion in proximity to said output port; and
   means for coupling said first output signal to said microstrip line end portion of said antipodal transition.

3. A high frequency millimeter wave low phase noise signal source module comprising:
   a transition enclosure having an input port and an output port;
   an antipodal finline transition extending longitudinally between said input and output ports of said enclosure, said antipodal transmission line including a microstrip line end portion in proximity to said input port, and a split end portion in proximity to said output port;
   an integrated circuit including circuit components therewith and arranged so as to provide:
      a first signal source means for providing a reference output signal at frequency $f_r$,
      a frequency doubling circuit means responsive to said reference output signal for providing a first output signal at frequency $f_2$, where $f_2$ is twice the value $f_r$, and
      a first transmission line strip having:
         a first end coupled to an output means of said frequency doubling circuit means for receiving said first output signal, and
         a second end coupled to said microstrip line end portion of said antipodal finline transmission line;
   means for coupling said first output signal to said microstrip line end portion of said antipodal transition;
   a housing for enclosing said integrated circuit and having a first housing end and a second housing end; and
   means for physically adjoining said second housing end portion to said first end portion of said transition enclosure.

4. The high frequency signal source of claim 3 wherein said integrated circuit further includes a high-Q dielectric puck resonator coupled to an oscillator circuit means for forming said first signal source means, and where said high Q dielectric puck resonator is tunable by way of a mechanical tuning means supported by said housing so as to be able to affect said resonant frequency of said puck, and tune said reference output frequency.

5. A high frequency signal source module comprising:
   a first housing for enclosing a high-Q dielectric puck resonator;
   a circuit module mounted within said first housing, said circuit module having,
      a first oscillator circuit means for providing a reference output signal at frequency $f_r$, and
      a frequency doubling circuit means responsive to said reference output signal for providing a first output signal at frequency $f_2$, where $f_2$ is twice the value $f_r$,
   a transition enclosure having a first end portion associated with an input port of said enclosure, and a second end portion associated with an output port of said enclosure, said enclosure including an antipodal finline transition extending longitudinally between first and second enclosure end portions, and where said antipodal finline transmission line includes a stripline end portion in proximity to said enclosure input port, and a split end portion in proximity to said enclosure output port; and means for coupling said first output signal to said stripline end portion of said antipodal finline transmission line.

6. A high frequency signal source module comprising:

a housing for enclosing a high-Q dielectric puck resonator, an enclosure for an antipodal finline transition;

a circuit module enclosed within said housing where said circuit module includes, an oscillator circuit means which cooperates with said high-Q puck for establishing a reference signal having low phase noise, and, a frequency doubling circuit means for frequency doubling said reference signal and providing an output signal indicative thereof; and means for coupling said output signal of said frequency doubling circuit means to said antipodal finline transition.

7. A high frequency millimeter wave low phase noise signal source module comprising:

an MMIC integrated circuit having a including circuit components therewith and arranged so as to provide:

a first signal source means for providing a reference output signal at frequency $f_r$;

a frequency doubling circuit means responsive to said reference output signal for providing a first output signal at frequency $f_2$, where $f_2$ is twice the value $f_r$, a transition enclosure having an input port and an output port;

an antipodal finline transition extending longitudinally between said input and output ports of said enclosure, said antipodal transmission line including a microstrip line end portion in proximity to said input port, and a split end portion in proximity to said output port; and means for coupling said first output signal to said microstrip line end portion of said antipodal transition.

8. The high frequency signal source of claim 7 wherein said MMIC integrated circuit is constructed having a Teflon like substrate upon which said circuit components are mounted thereon.

9. The high frequency signal source of claim 7 wherein said integrated circuit means further includes a high-Q dielectric puck resonator coupled to an oscillator circuit means for forming said first signal source means, and where said high Q dielectric puck resonator is tunable by way of a mechanical tuning means supported by said housing so as to be able to affect said resonant frequency of said puck, and tune said reference output frequency.

10. The high frequency signal source of claim 1 wherein said integrated circuit means further includes a tunable high-Q dielectric puck resonator coupled to an oscillator circuit means for tuning said reference output frequency.

11. The high frequency signal source of claim 2 wherein said first signal source further includes a tunable high-Q dielectric puck resonator coupled to an oscillator circuit for tuning said reference output frequency.

12. The high frequency signal source of claim 1 wherein said integrated circuit further includes a signal amplifier having an input means for receiving said reference output signal, and having an output means coupled to an input means of said frequency doubling circuit means.

13. The high frequency signal source of claim 7 wherein said integrated circuit further includes a signal amplifier having an input means for receiving said reference output signal, and having an output means coupled to an input means of said frequency doubling circuit means.

* * * * *